United States Patent
Bäcksin et al.

(10) Patent No.: US 10,952,291 B2
(45) Date of Patent: Mar. 16, 2021

(54) LAMINAR LUMINAIRE AND METHOD OF MANUFACTURE

(71) Applicant: Light Flex Technology, S. L., Barcelona (ES)

(72) Inventors: Victoria Bäcksin, Barcelona (ES); Marten Kull, Barcelona (ES)

(73) Assignee: Light Flex Technology, S.L., Barcelona (ES)

( * ) Notice: Subject to any disclaimer, the term of this patent is extended or adjusted under 35 U.S.C. 154(b) by 0 days.

(21) Appl. No.: 16/633,821

(22) PCT Filed: Jul. 26, 2017

(86) PCT No.: PCT/ES2017/070537
§ 371 (c)(1),
(2) Date: Jan. 24, 2020

(87) PCT Pub. No.: WO2019/020841
PCT Pub. Date: Jan. 31, 2019

(65) Prior Publication Data
US 2020/0178368 A1    Jun. 4, 2020

(51) Int. Cl.
| | |
|---|---|
| H05B 33/04 | (2006.01) |
| F21V 33/00 | (2006.01) |
| H05B 33/10 | (2006.01) |
| H05B 33/20 | (2006.01) |
| H05B 33/12 | (2006.01) |

(52) U.S. Cl.
CPC ......... H05B 33/04 (2013.01); F21V 33/0008 (2013.01); H05B 33/10 (2013.01); H05B 33/12 (2013.01); H05B 33/20 (2013.01)

(58) Field of Classification Search
CPC ........ H05B 33/04; H05B 33/10; H05B 33/20; H05B 33/12; H05B 33/14; H05B 33/145
See application file for complete search history.

(56) References Cited

U.S. PATENT DOCUMENTS

| | | | |
|---|---|---|---|
| 5,794,366 A | 8/1998 | Chien | |
| 5,976,613 A * | 11/1999 | Janusauskas | H05B 33/04 204/192.17 |
| 6,175,186 B1 * | 1/2001 | Matsuura | H01L 27/3246 313/483 |
| 2008/0019119 A1 | 1/2008 | Marston | |
| 2011/0036623 A1 | 2/2011 | Keite-Telgenbuscher et al. | |
| 2011/0290304 A1 | 12/2011 | Daniel | |

(Continued)

FOREIGN PATENT DOCUMENTS

| | | |
|---|---|---|
| EP | 2213931 A1 | 8/2010 |
| EP | 3131369 A1 | 2/2017 |
| WO | 1999067568 A1 | 12/1999 |

*Primary Examiner* — Scott B Geyer
(74) *Attorney, Agent, or Firm* — Holzer Patel Drennan

(57) ABSTRACT

Electroluminescent laminar luminaire comprising a laminar substrate (2), at least one flexible electroluminescent lamp (1) printed on the substrate (2), and electric power supply means of the EL lamp (1) housed together inside an encapsulating casing (8). The latter contains at least one hot-melt adhesive (HMA), preferably EVA, and accurately matches the external shape of the EL lamp (1) and the relief, and the electric power supply means that protrude from the substrate (2), covering them fully without leaving any gaps, constituting a closed, flexible, compact and fluid-tight luminaire (100).

9 Claims, 2 Drawing Sheets

(56) References Cited

U.S. PATENT DOCUMENTS

2014/0327356 A1* 11/2014 Nakai .................... H05B 33/04
                                                                    315/34
2017/0027249 A1*  2/2017 Kull .................... F21V 33/0008
2017/0299156 A1* 10/2017 Yoneyama .......... F21V 19/0015

* cited by examiner

LAMINAR LUMINAIRE AND METHOD OF MANUFACTURE

OBJECT OF THE INVENTION

The present invention relates, in a first aspect, to a laminar luminaire, of the type comprising a laminar substrate, at least one flexible lamp, which may for example be electroluminescent, printed on the substrate, and electric power supply means of the electroluminescent lamp (hereinafter EL), housed together inside an encapsulating casing.

The present invention also relates to a method of manufacture of the aforesaid type of laminar luminaire.

FIELD OF APPLICATION OF THE INVENTION

The present invention has applications in the manufacture of electroluminescent laminar luminaires, LEDs, reflecting or fluorescent bands, etc.

BACKGROUND OF THE INVENTION

The existence of flexible laminar lamps is known, in particular electroluminescent lamp, which, consisting of sheets made up of several layers, emit their own light when connected to a power source, normally being intended to be incorporated into garments for protection and safety in low-visibility situations, such as signaling in activities like cycling, motorcycling, night skiing, public works, traffic control activities, life vests, footing or trekking, as well as transmitting warning or even advertising messages.

There are variations of these flexible electroluminescent laminar lamps with multiple inner layers over a substrate, including an EL lamp, and electrodes or electric power supply means, or other elements, protruding from the lamp, for which the assembly is completed with a final layer or casing for encapsulation and protection.

Patent US2007161314, shows a method for manufacturing an electroluminescent lamp, comprising a front electrode, a phosphor layer, a dielectric layer and an electrode layer, with connecting devices attached to each dividing electrode area, and that are adapted to be connected to a power source. The lamp can have the shape of a flexible panel, made up of an inner multilayer cell sealed with a watertight casing. Nevertheless, this application does not describe nor does it suggest how to make the watertight casing.

Patent WO2015162308A1 describes a light-emitting textile element with a free connection system which, with a structure comprising at least one electroluminescent lamp containing a substrate layer, electrodes, an active dielectric layer, an electroluminescent layer, a transparent conductive layer, and a reflective upper later joined to the substrate and having holes, spaced along the entire length of the textile element to receive the insertion of metallic pins of a connector part connecting to the control electronics and electric power source for the operation thereof. These holes, with or without the insertion of the pins, represent points of discontinuity that could allow the entry of water and liquids, and make it difficult to clean the element.

Patent PCT WO2015155382A1 discloses a compact electroluminescent laminar luminaire constituting the preamble of the present independent claim, comprising, on a substrate, a flexible electroluminescent lamp printed on the substrate, and electric power supply means of the electroluminescent lamp, housed together inside the encapsulating element, constituting a closed and compact laminar element.

Since, in this case, the luminaire itself may contain the control electronics on the substrate, in other words, an electronic module that, linked in the same layer as the lower electrode, incorporates an electronic control component, an electronic activation component of the lamp and a battery. This creates a thickening in the assembly and entails a problem in that between the substrate and the encapsulating laminar element, there is a gap that can contain air and create sealing problems, especially when washing the garment on which the luminaire is coupled.

U.S. Pat. No. 5,491,377, also relating to a "Electroluminescent lamp and method" which, further comprising a substrate layer, a first electrode, an intermediate phosphor layer, an active dielectric layer, a second electrode, a conductor and a protecting or encapsulating layer comprises, in this case, a single non-hygroscopic binder that is used for all the layers (with the optional exception of the rear or lower electrode), thereby reducing delamination as a result of temperature changes and susceptibility to moisture. However, this patent presents the problem of tending to make the lamp rigid, which can make it lose the tightness and elasticity thereof and make it difficult to iron the garment upon which it is arranged.

However, it is not observed that any of the foregoing inventions and patents, taken separately or in combination, describes the present invention, as claimed.

DESCRIPTION OF THE INVENTION

The aim of the present invention is that of providing a luminaire, eventually although not exclusively, electroluminescent, which is free of the previous problems and disadvantages, for which the object of the present invention, according to a first aspect, consists of a laminar luminaire, of new concept and functional nature, which in essence is characterized in that the encapsulating casing contains at least one hot-melt adhesive (HMA) and accurately matches the external shape of the lamp and the relief and the electric power supply means that protrude from the substrate, covering them fully without leaving any gaps, constituting a closed, flexible, compact and fluid-tight luminaire.

The laminar lamp can be, for example, an electroluminescent (EL) lighting band, LED or a reflecting band, etc.

The hot-melt adhesive is at least one selected from the list consisting of: ethylvinylacetate (EVA), vinyl acetate (VAM), and polyvinyl acetate (PVAc). However, the preferred material is EVA.

According to a first embodiment of the present invention, the electric power supply means comprise an electronic module, joined to the substrate and electrically linked to the lamp, and containing an electronic control element, a battery and an electronic activation component of the lamp, such that the lamp is autonomous with respect to the electric power supply.

According to a second embodiment of the present invention, the electric power supply means comprise electrodes endowed with connectors in order to be coupled to an external electric power source of the electroluminescent lamp to the luminaire.

In this second embodiment, the connectors can be connected directly to a known recharging battery, or to charging cables that conduct the electrical current from the connectors to the terminals of a battery or other recharging source.

These conducting cables can also be encapsulated in the HMA just like the luminaire, in order to acquire the same tightness and resistance properties.

A second object of the invention is the development of a method of manufacture of a laminar luminaire, which consists of the following steps:
  printing on a substrate at least one flexible lamp;
  arranging on the substrate electric power supply means of the flexible lamp;
  enclosing the assembly inside an encapsulating casing, containing at least one hot-melt adhesive (HMA);
  applying heat to the encapsulating casing until the encapsulating casing melts and adheres to the assembly, matching the shape thereof to the outline of the assembly; and
  allowing the encapsulated luminaire to cool inside the encapsulating casing, and forming a closed, flexible, compact and fluid-tight luminaire.

An additional step prior to the step of cooling the luminaire has been provided,
  Adhering the luminaire, through the still molten encapsulating casing to a support body, such as, for example, a textile or plastic element of a garment or footwear.

Likewise, the hot-melt adhesive is at least one selected from the list made up of: ethylvinylacetate (EVA), vinyl acetate (VAM), and polyvinyl acetate (PVAc).

BRIEF DESCRIPTION OF THE DRAWINGS

Here below is a detailed description of preferred but not exclusive embodiments of the laminar luminaire and the method of manufacture thereof, object of the invention, for the better understanding of which a set of drawings is provided, which, by way of a illustration and not limitation, along with said embodiments of the present invention, illustrate the following.

DETAILED DESCRIPTION OF THE DRAWINGS

Figure 1:
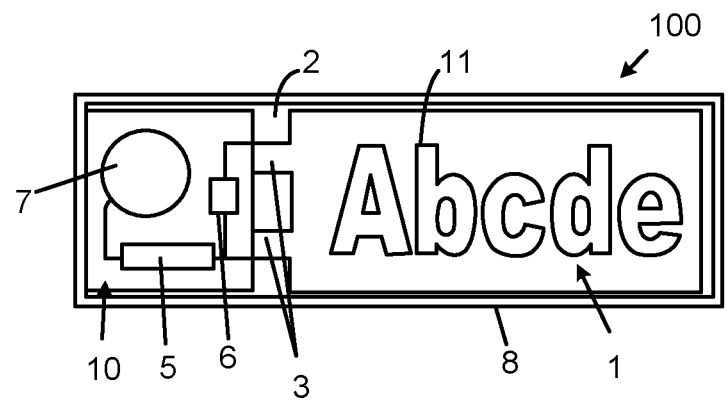
FIG. 1 is a schematic front view of a first embodiment of the laminar luminaire, based on an electroluminescent laminar lamp (EL) of the present invention.

In said drawings it can be seen that the electroluminescent laminar luminaire (100) of the present invention is essentially constituted by three laminar-type layers:
  a laminar substrate (2);
  a flexible electroluminescent lamp (1) printed on the substrate (2); and
  an encapsulating casing (8) containing at least one hot-melt adhesive (HMA), and that can have one or two layers, depending on whether it has to be affixed in one way or another to a garment or other object.

The hot-melt adhesive is ethylvinylacetate (EVA), although other thermo-adhesive adhesives are possible such as vinyl acetate (VAM), polyvinyl acetate (PVAc), etc.

By applying heat to sheets of encapsulating casing (8), these melt and the adhesive adheres to the external surfaces of the luminaire (100), whether they are flat, concave or convex, fully matching the shape thereof.

Once the hot-melt adhesive is cured and cooled again, the encapsulating casing (8) remains making up one unit with the rest of the elements of the lamp (100), which retains the flexibility, tightness and laminar character thereof.

The luminaire has electric power supply means of the EL lamp (1), housed together inside the laminar casing (8), which vary according to the specific application of the luminaire (100).

Figure 2:
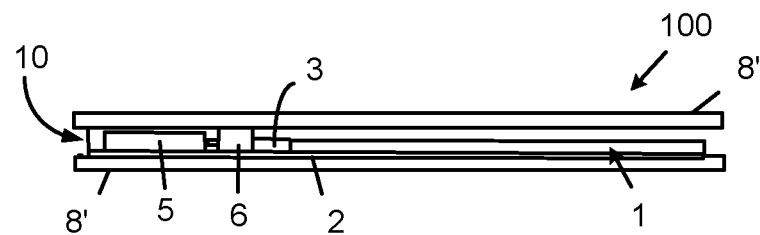
FIG. 2 is a cross-sectional view illustrating a first step in the method of manufacture of the EL laminar luminaire of FIG. 1, wherein the HMA layer has been superimposed in cold mode, prior to heating thereof.
Figure 3:
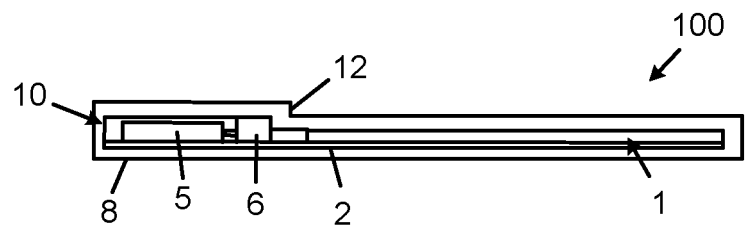
FIG. 3 is a similar view to that of FIG. 2 illustrating in a cross section the constitution of the EL laminar luminaire once it has been made departing from the situation shown in FIG. 2, in which heat has already been applied to the HMA layer, forming the encapsulating casing.

The first exemplary embodiment of FIGS. 1, 2 and 3, shows the case of a luminaire (100) especially intended for illuminating a logo (11) of EL material, as shown in FIG. 1. In this case, the electric power supply means comprise an electronic module (10), joined to the substrate (2) and electrically linked to the EL lamp (1). The electronic module (10) contains an electronic control component (5), a battery (7), and an electronic activation component (6) of the EL lamp (1), so that the luminaire (100) is autonomous with respect to the electric power supply. Electrodes (3) electrically join the electronic activation component (6) with the logo (11).

FIG. 2 shows a first step in the method of manufacture of the EL laminar luminaire (100) of this first exemplary embodiment, in which two layers (8') of HMA adhesive have been superimposed in cold mode, prior to the heating thereof, on both sides of the surfaces of the assembly formed by the laminar substrate (2), the logo (11) of the flexible electroluminescent lamp, the electronic module (10) and the electrodes (3).

FIG. 3 shows the constitution of the EL laminar luminaire (100) once it has been made departing from the situation shown in FIG. 2, in which heat has already been applied to the HMA layer (8'), making up the encapsulating casing (8) that covers the entire assembly, matching the shape. The numerical reference (12) indicates a recess produced in the casing (8) due to the adherence obtained with the curing of the HMA adhesive.

Figure 4:
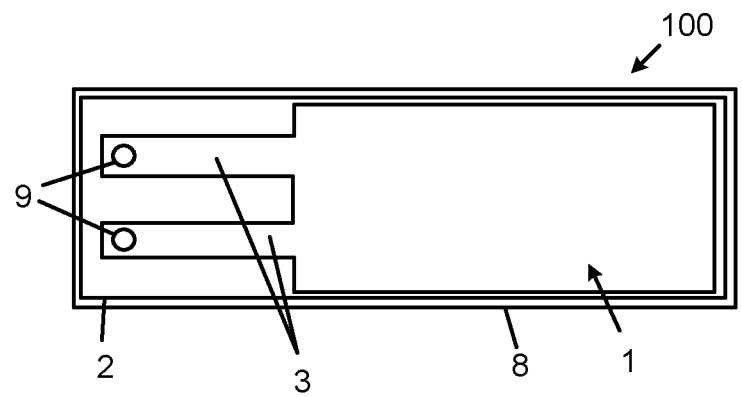
FIG. 4 is a schematic front view of a second embodiment of the EL laminar luminaire of the present invention.
Figure 5:
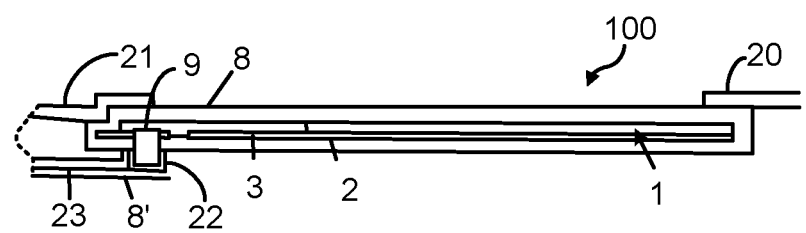
FIG. 5 is a similar view to that of FIG. 3 illustrating in a cross section the constitution of the EL laminar luminaire of this second embodiment, of FIG. 4, in which heat has already been applied to the HMA layer, forming the encapsulating casing.

The second exemplary embodiment of FIGS. 4 and 5 shows a luminaire (100) especially intended to form part of a continuous band of continuous illumination. In this case, the electric power supply means comprise electrodes (3) secured to two pin-shaped male connectors (9), in order to be coupled to an external electric power source of the EL lamp (1) of the luminaire (100).

FIG. 5 shows the case in which the EL luminaire (100) has been adhered to areas (20) of a textile element of a garment, footwear, etc. in which the EL luminaire (100) of the invention will be used. This option is also possible in the EL luminaire (100) of the first embodiment (FIGS. 1, 2 and 3), intended for an electroluminescent logo.

FIG. 5 also shows the terminals (23) of a cable (22) also covered with the HMA encapsulating casing (8'), connected to the connectors (9) of the EL luminaire (100) of this second embodiment of the present invention.

Likewise, the terminals of a charging battery box (not shown) can be directly connected to the connectors (9).

Generally, the method for manufacturing an electroluminescent laminar luminaire (100) according to the invention consists of the following steps:

applying, for example, by means of luminescent ink printing techniques, on a substrate (2), at least one EL flexible electroluminescent lamp (1);

arranging electric power supply means of the EL lamp (1) on the substrate (2);

cold-closing the assembly inside an encapsulating casing (8), containing at least one layer (8') of hot-melt adhesive (HMA);

applying heat to the encapsulating casing (8), which adheres to the external outline of the assembly;

melting the encapsulating casing (8), matching the shape thereof to the outline of the luminaire and making up a closed, flexible, compact and fluid-tight luminaire (100);

optionally, adhering the EL luminaire, through the still molten encapsulating casing to a support body, such as, for example, a textile or plastic element of a garment or footwear; and allowing the encapsulated luminaire (100) to cool inside the encapsulating casing (8).

For example, HMA materials may differ from those cited as examples, or the EL luminaire could incorporate other laminar elements therein, such as, for example, a phosphorescent or reflective band (not shown), all of this falling within the scope of the inventive concept.

Having sufficiently described the nature of the present invention, as well as the manner of putting it into practice, it should be noted that all that which does not alter, change or modify the fundamental principle thereof, is subject to variations in detail.

The invention claimed is:

1. An electroluminescent laminar luminaire (100) comprising a laminar substrate (2), at least one flexible electroluminescent (EL) lamp (1) printed on the substrate (2), and an electric power supply means of the EL lamp (1), the substrate (2), the EL lamp (1) and the electric power supply means housed together inside an encapsulating casing (8), characterized in that the encapsulating casing (8) contains at least one hot-melt adhesive (HMA) and the encapsulating casing (8) accurately conforms to an external shape of the substrate (2), the EL lamp (1) and the electric power supply means, with the electric power supply means protruding from the substrate (2), the encapsulating casing (8) covering the substrate (2), the EL lamp (1) and the electric power supply means fully without leaving any gaps, the electroluminescent laminar luminaire (100) being a closed, flexible, compact and fluid-tight luminaire (100).

2. The electroluminescent laminar luminaire, according to claim 1, characterized in that said at least one hot-melt adhesive comprises ethylvinylacetate (EVA).

3. The electroluminescent laminar luminaire, according to claim 1, characterized in that said at least one hot-melt adhesive comprises vinyl acetate (VAM).

4. The electroluminescent laminar luminaire, according to claim 1, characterized in that said at least one hot-melt adhesive comprises polyvinyl acetate (PVAc).

5. The electroluminescent laminar luminaire, according to claim 1, characterized in that said electric power supply means comprises an electronic module (10) joined to the substrate (2) and electrically linked to the EL lamp (1), the electronic module (10) containing an electronic control component (5), a battery (7) and an electronic activation component (6).

6. The electroluminescent laminar luminaire, according to claim 1, characterized in that said electric power supply means comprises electrodes (3) endowed with connectors (9) coupled to an external electric power source of the EL lamp (1).

7. A method of manufacture of an electroluminescent laminar luminaire (100), comprising the following steps:

printing on a substrate (2) at least one flexible electroluminescent (EL) lamp (1);

arranging on the substrate an electric power supply means of the EL lamp (1) to form an assembly comprising the substrate (2), the EL lamp (1) and the electric power supply;

cold-closing the assembly inside an encapsulating casing (8) containing at least one layer (8') of a hot-melt adhesive (HMA);

heating the encapsulating casing (8) to melt the HMA to the assembly, conforming the encapsulating casing (8) to the assembly;

allowing the encapsulated assembly to cool inside the heated encapsulating casing (8), thus forming a closed, flexible, compact and fluid-tight luminaire.

8. The method according to claim 7, characterized in that, prior to allowing the encapsulated assembly to cool:

adhering the heated encapsulating casing enclosing the assembly to a support body via the melted HMA.

9. The method according to claim 7 or 8, characterized in that said hot-melt adhesive comprises at least one selected from the list made up of: ethylvinylacetate (EVA), vinyl acetate (VAM), and polyvinyl acetate (PVAc).

* * * * *